United States Patent
Smith

(10) Patent No.: US 6,697,241 B1
(45) Date of Patent: Feb. 24, 2004

(54) CIRCUIT FOR PREVENTING HIGH VOLTAGE DAMAGE TO A MOSFET SWITCH IN SERIES WITH AN INDUCTOR WHEN CURRENT FLOW IS INTERRUPTED

(75) Inventor: Gregory J. Smith, Tucson, AZ (US)

(73) Assignee: National Semiconductor Corporation, Santa Clara, CA (US)

( * ) Notice: Subject to any disclaimer, the term of this patent is extended or adjusted under 35 U.S.C. 154(b) by 271 days.

(21) Appl. No.: 09/834,416

(22) Filed: Apr. 12, 2001

Related U.S. Application Data

(60) Provisional application No. 60/274,443, filed on Mar. 9, 2001.

(51) Int. Cl.[7] ................................................ H02H 3/20
(52) U.S. Cl. ...................... 361/91.1; 361/91.3; 361/93.1
(58) Field of Search ............................... 361/93.1, 100, 361/91.1, 91.3, 91.5

(56) References Cited

U.S. PATENT DOCUMENTS

| | | | |
|---|---|---|---|
| 5,684,663 A | * 11/1997 | Mitter | 361/106 |
| 6,043,965 A | * 3/2000 | Hazelton et al. | 361/84 |
| 6,185,082 B1 | * 2/2001 | Yang | 361/90 |
| 6,201,677 B1 | * 3/2001 | Sakamoto et al. | 361/93.1 |
| 6,385,025 B2 | * 5/2002 | Sakamoto et al. | 361/93.8 |
| 6,385,028 B1 | * 5/2002 | Kouno | 361/111 |
| 6,430,016 B1 | * 8/2002 | Marr | 361/56 |

\* cited by examiner

*Primary Examiner*—Bao Q. Vu

(57) ABSTRACT

A circuit for preventing high voltage damage to a MOSFET switch in series with an inductor when current flow is interrupted. Specifically, the present invention discloses a protection circuit comprising a PMOS coupled in series to a load, an inductor, and a re-chargeable battery cell. The PMOS is switched to a non-conductive state by a switch in order to prevent over-loading the protection circuit. A clamp circuit temporarily allows the PMOS to conduct when a positive rate change of voltage with respect to time occurs at the gate of the PMOS. The clamp circuit is coupled to the gate of the PMOS. In one embodiment, the clamp circuit has an RC time constant and is comprised of an NMOS, a capacitor, and a pull-down resistor.

20 Claims, 4 Drawing Sheets

CIRCUIT FOR PREVENTING HIGH VOLTAGE DAMAGE TO A MOSFET SWITCH IN SERIES WITH AN INDUCTOR WHEN CURRENT FLOW IS INTERRUPTED

This application claims the benefit of Provisional No. 60/274,443 filed Mar. 9, 2001.

BACKGROUND OF THE INVENTION

1. Field of the Invention

The present invention relates to the field of protection circuits for rechargeable battery cells. More specifically, the present invention relates to the field of protection circuits that address inductive flyback when current flow is interrupted to a load through the metal oxide semiconductor field effect transistor (MOSFET) switch.

2. Related Art

Rechargeable battery packs require a means for limiting the discharge current when an excessive load is applied to the pack's terminals. For example, a protection circuit will protect against an effective short circuit of the battery. Typically, a series MOSFET switch and a protection circuit that monitors the state of the discharge current is used for this function. However, a problem exists in this standard approach in that high voltage due to parasitic inductance will damage the protection circuit.

FIG. 1 of the prior art shows a circuit 100 with a p-channel MOSFET (PMOS) switch protection circuit 110 as represented within the dotted lines. A parasitic lead inductance originates from a parasitic inductor 120 that is in series between the rechargeable battery cell 130 and the protection circuit 110.

A PMOS 115 either conducts or is turned-off depending on the state of the switch 117. A overcurrent sensor (not shown) senses the current flowing through the protection circuit and through system 100. When the system 100 is in a normal operation, the switch 117 is set to ground allowing the PMOS 115 to conduct. When the overcurrent sensor senses that an extremely high current load is applied to the protection circuit and the system 100, the switch 117 is thrown to the right tying the source and the gate of the PMOS 115 together. This, in turn, puts PMOS 115 into a non-conducting state since $V_{GS}$ is zero.

FIG. 1 of the prior art depicts a nominal value current ($I_{loadDC}$) flowing from the battery cell 130, through the inductor 120 and the conducting PMOS switch into a nominal load.

A typical situation where an effective short is placed across the battery cell 130 is also shown in FIG. 1. At time t=0, a very high current load is applied, such as when a capacitor 150 with a charge of zero volts is put onto the circuit. As discussed previously, the sensing circuit (not shown) will throw the switch 117 to the right in order to put the PMOS 115 into a non-conductive state in order to protect the battery cell 130 from a short circuit.

The application of this load forces the voltages at both $V_B$, at node 113, and $V_A$, at node 119, to drop. The voltage at $V_A$ is set by the resistor divider formed by the on-resistance of the MOSFET switch and the effective series resistance (ESR) of the battery.

This resulting instantaneous interruption of cell current causes the voltage across the parasitic inductor to rapidly increase with a reverse potential. In other words, the inductance through the parasitic inductor is great enough to establish many volts of flyback through the inductor. Since there is no significant impedance from the source or gate of the PMOS to ground, the voltage at $V_A$ is effectively unbounded except by flyback voltage.

Thus, the magnitude of voltage increase at $V_A$ is often enough to exceed the absolute maximum voltage rating of the protection circuit's IC process. This can damage circuitry by either breaking down junctions or oxides. This scenario occurs in circuits with both practical component values and with practical protection circuit response times.

SUMMARY OF THE INVENTION

Accordingly, a circuit for preventing high voltage damage to a metal oxide semiconductor field effect transistor (MOSFET) switch in series with an inductor and a rechargeable battery source is described. The present invention provides for a circuit that addresses the high voltages resulting from inductive flyback when current flow is interrupted through the protection circuit.

Specifically, in one embodiment of the present invention, the present invention discloses a protection circuit comprising a transistor and a clamp circuit. The transistor is coupled in series to a load, an inductor, and a rechargeable battery cell. The clamp circuit temporarily turns-on the transistor when the transistor has been turned-off by a switch and the gate and source voltage rises. The clamp circuit is coupled to the gate of the transistor.

The transistor, in one embodiment, is a p-channel MOSFET (PMOS) field effect transistor. The PMOS includes a source terminal that is coupled in series with the inductor and to a positive terminal of said battery cell. The PMOS also includes a drain terminal coupled to the load.

The protection circuit also includes a switch for turning-off the transistor when a high current overload is detected in the protection circuit. The switch couples the PMOS gate to the PMOS source when the switch turns-off the transistor.

The clamp circuit temporarily allows for the transistor that has been turned-off to conduct when a positive rate change of voltage with respect to time occurs at the PMOS gate.

In one embodiment of the present invention, the clamp circuit is a differentiator circuit with an RC time constant. The differentiator circuit is comprised of a capacitor, a pull-down resistor, and an n-channel MOSFET (NMOS).

Specifically, another embodiment of the present invention discloses a protection circuit comprising a PMOS coupled in series to a load, an inductor, and a rechargeable battery cell. The PMOS is switched to a non-conductive state by a switch in order to prevent overloading the protection circuit. A clamp circuit temporarily allows the PMOS to conduct when a positive rate change of voltage with respect to time occurs at the gate of the PMOS. The clamp circuit is coupled to the gate of the PMOS. The clamp circuit has an RC time constant and is comprised of an NMOS, a capacitor, and a pull-down resistor.

These and other objects and advantages of the present invention will no doubt become obvious to those of ordinary skill in the art after having read the following detailed description of the preferred embodiments which are illustrated in the various drawing figures.

BRIEF DESCRIPTION OF THE DRAWINGS

PRIOR ART

Figure 1:
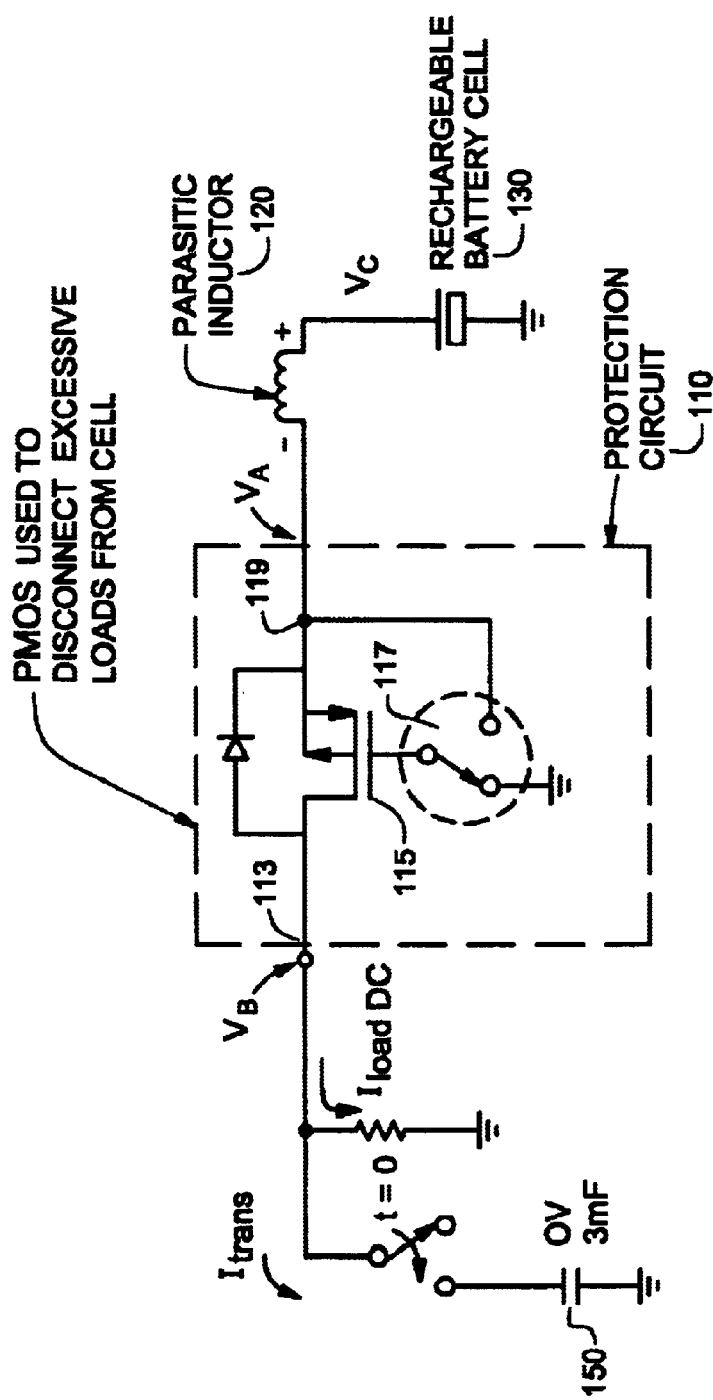

FIG. 1 is circuit diagram of a protection circuit susceptible to high voltage damage due to inductive flyback when current is interrupted.

Figure 2A:
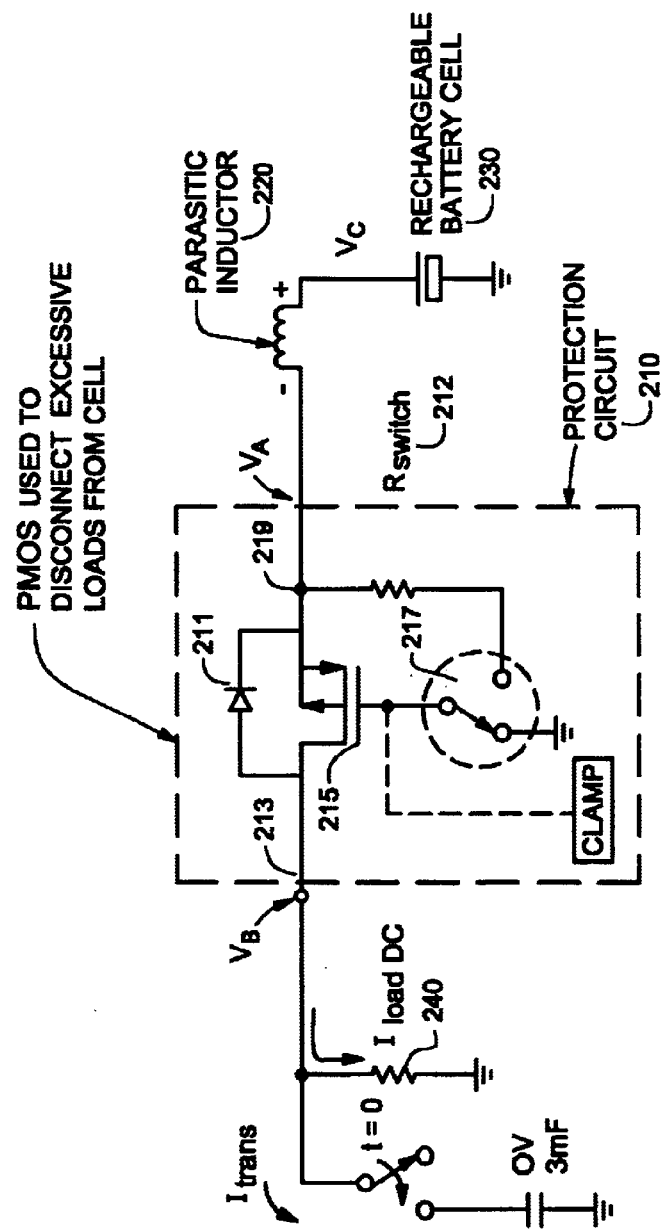

FIG. 2A is a circuit diagram of a protection circuit in a normally conductive state that protects against high voltage damage due to inductive flyback when current is interrupted, in accordance with one embodiment of the present invention.

Figure 2B:
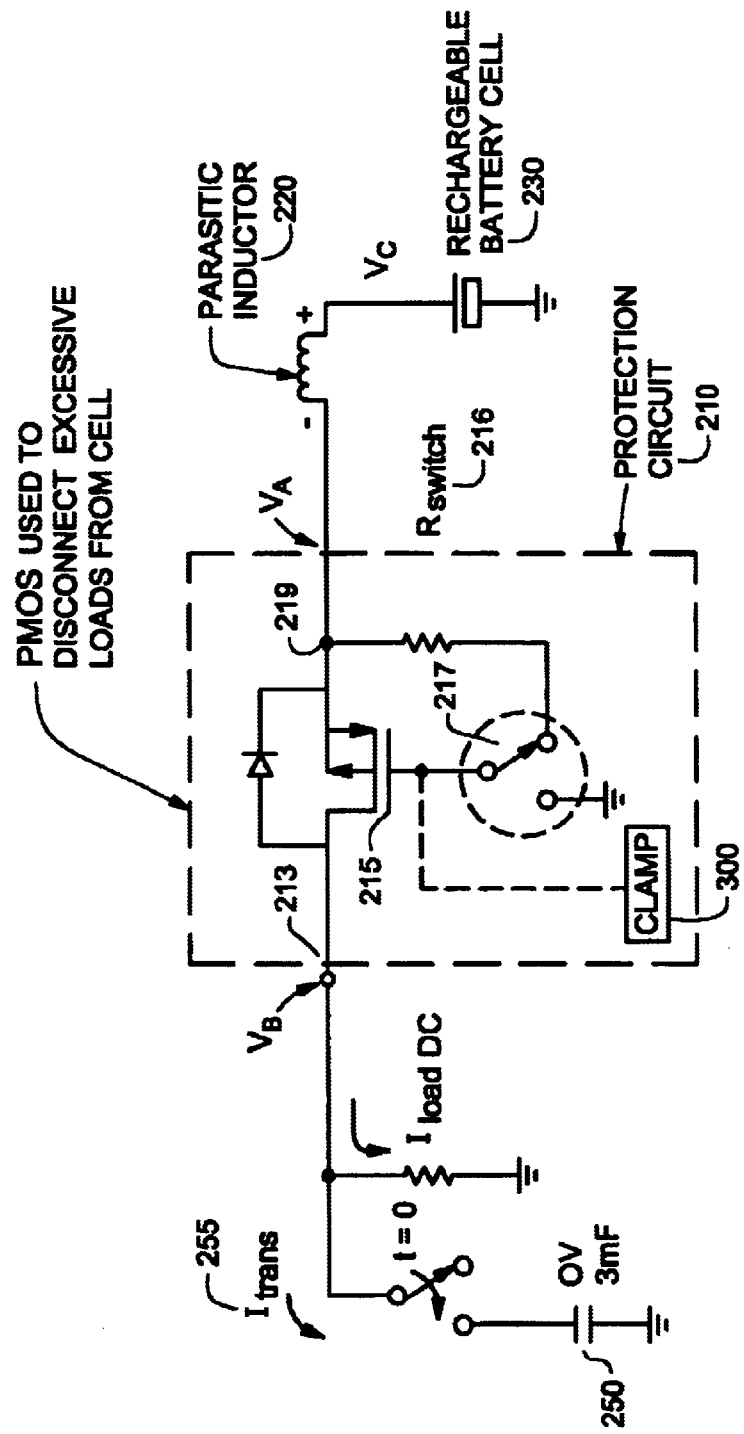

FIG. 2B is a circuit diagram of a protection circuit that protects against high voltage damage due to inductive flyback with the PMOS in a non-conductive state, in accordance with one embodiment of the present invention.

Figure 3:
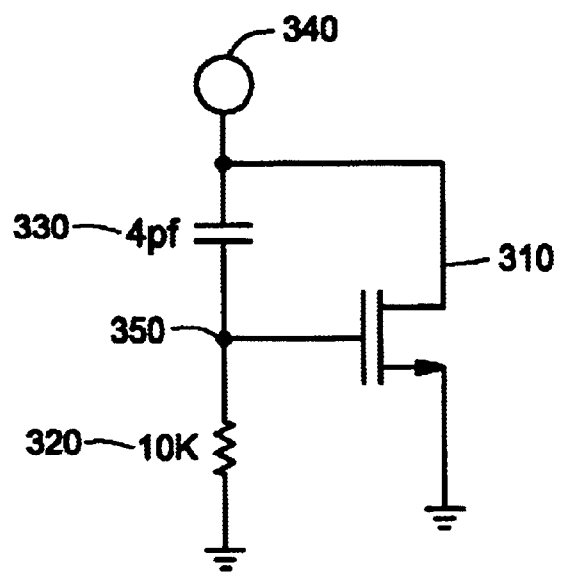

FIG. 3 is a circuit diagram of a clamp circuit used in a protection circuit for protecting against high voltage damage due to inductive flyback, in accordance with one embodiment of the present invention.

DETAILED DESCRIPTION OF THE INVENTION

Reference will now be made in detail to the preferred embodiments of the present invention, a circuit for preventing high voltage damage in a metal oxide semiconductor field effect transistor (MOSFET) due to inductive flyback when current is interrupted, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Accordingly, a circuit for protecting against high voltage damage in a MOSFET switch in series with an inductor and a rechargeable battery cell is described. The present invention provides for a protection circuit that addresses the high voltages resulting form inductive flyback when current flow is interrupted through the protection circuit.

In accordance with one embodiment of the present invention, a protection circuit for protecting against high voltage damage due to inductive flyback includes a transistor coupled in series to a load, an inductor, and a battery cell. The protection circuit also includes a clamp circuit for temporarily turning-on the transistor when the transistor is turned-off. The clamp circuit is coupled to the gate terminal of the transistor. The battery cell is rechargeable in another embodiment. Also, in another embodiment, the protection circuit is formed on a semiconductor substrate and comprises an IC chip.

FIG. 2A is a circuit diagram of a circuit 200 showing a protection circuit in a normally conductive state that protects against high voltage damage due to inductive flyback when current is interrupted, in accordance with one embodiment of the present invention. Circuit 200 includes a p-channel MOSFET (PMOS) switch protection circuit 210 as represented within the dotted lines. A parasitic lead inductance originates from a parasitic inductor 220 that is in series between the rechargeable battery cell 230 and the protection circuit 210.

A PMOS 215 either conducts or is turned-off depending on the state of the switch 217. A overcurrent sensor (not shown) senses the current flowing through the protection circuit and through system 200. FIG. 2A shows the switch 217 in a state that allows the PMOS 215 to conduct in a normally conductive state. In this case, the switch 217 is positioned to the left and is connected to ground. The switch is coupled in series with the gate of the PMOS 215.

A reversed bias diode 211 is shown coupled across the drain terminal and source terminal of the PMOS 215. The diode 211 is coupled to nodes 213 and 219. Similarly, the drain terminal of the PMOS 215 is coupled in series via node 213 to a load across resistor 240, as represented as $I_{loadDC}$. Also, the source terminal of the PMOS 215 is coupled in series via node 219 to the parasitic inductor 220 and a rechargeable battery cell 230.

FIG. 2B is a circuit diagram of the system 200 showing a protection circuit that protects against high voltage damage due to inductive flyback with the PMOS in a non-conductive state, in accordance with one embodiment of the present invention.

In FIG. 2B, when the overcurrent sensing circuit (not shown) senses that an extremely high current load is applied to the protection circuit and the system 200, the switch 217 is thrown to the right tying the source and the gate of the PMOS 115 together. For example, at time t=0, a very high current load is applied, such as when a capacitor 250 with a charge of zero volts is put onto the circuit 200. The transient current 255 is sensed by the overcurrent sensing circuit and turns off the PMOS 215 via switch 217. The switch 217 protects the cell from current discharges. This, in turn, puts PMOS 115 into a non-conducting state since $V_{GS}$ approaches zero.

Again, as discussed previously, without a means for releasing the inductive energy, the resulting instantaneous interruption of cell current causes the voltage across the parasitic inductor to rapidly increase with a reverse potential. In other words, the change in inductance through the parasitic inductor is great enough to establish many volts of flyback through the inductor. Since there is no significant impedance from the source or gate of the PMOS to ground, the voltage $V_A$ at node 219 is effectively unbounded.

However, the system 200 in FIG. 2B includes a clamp circuit 300 that temporarily allows the PMOS 215 to conduct, in accordance with one embodiment of the present invention. The clamp circuit allows the PMOS 215 to conduct just enough to release the substantial amount of energy stored in the parasitic inductor 220. The clamp circuit 300 is coupled to the gate of the PMOS 215. An resistor R-switch 212 is also shown in FIG. 2B.

The clamp circuit 300 in FIG. 2B allows for current to flow through the R-switch 212. This effectively turns the PMOS 215 back-on in order to release the stored energy in the parasitic inductor 220. This protects the protection circuit 210 from high voltage damage due to inductive flyback.

FIG. 3, in relation to FIG. 2B, illustrates an exemplary clamp circuit 300 that is activated by the positive rate or change in voltage over time at the gate of the PMOS 215 and for $V_A$ at node 219 when current is interrupted in the protection circuit 210, in accordance with one embodiment of the present invention. The clamp circuit 300 in effect comprises a differentiator.

Additionally, the clamp circuit 300 as shown in FIG. 3 is self-timed. The clamp circuit 300 has an RC time constant that allows for the PMOS 215 to conduct as long as the inductor is able to slew the voltage $V_A$ at node 219. As soon as the change in voltage at $V_A$ ceases, then the voltage over the R-switch 212 collapses and the PMOS returns to its non-conductive state.

The clamp circuit 300, as shown in FIG. 3, turns on only during the rising edge of $V_A$ (and therefore, the PMOS gate if $V_{GS}=0$). Allowing the PMOS 215 to conduct limits the potential at the gate of the PMOS. This clamp circuit 300 effectively provides a pull down on the PMOS gate, and in a sense clamps $V_A$ with the PMOS 215 device. The clamp circuit 300 turns on the PMOS current path that releases the energy stored in the inductor without exceeding the absolute maximum rating of the protection circuit.

FIG. 3 is a circuit diagram of an exemplary clamp circuit 300 used in a protection circuit for protecting against high voltage damage due to inductive flyback, in accordance with one embodiment of the present invention. As discussed previously, the clamp circuit 300 is a differentiator including a capacitor 330, a pull-down resistor 320, and an n-channel MOSFET (NMOS) 310.

The capacitor 330 in clamp circuit 300 includes a first terminal and a second terminal. The NMOS 310 includes a gate, a drain, and a source. Clamp circuit 300 also includes a top terminal 340 that is coupled to the gate of the PMOS 215, to the first terminal of the capacitor 330, and to the drain of the NMOS 310. Also, clamp circuit 300 includes a node 350 that is coupled to the gate of the NMOS 310, to the second terminal of the capacitor 330. Node 350 also is coupled in series with the pull-down resistor 320 and ground. Additionally, the source of the NMOS 310 in clamp circuit 300 is tied to ground.

In another embodiment of the present invention, the capacitor 330 has a value of 4 picofarads, and the pull-down resistor 320 has a value of 10,000 ohms.

During normal operation, as is illustrated in FIG. 2A, the clamp circuit 300 is forced off because the pull-down resistor pulls the gate of PMOS 215 low.

However, when the protection circuit 210 turns-off the PMOS 215, only a sufficiently large positive change in voltage (dV/dt) potential at the drain of the NMOS 310 is able to generate enough current in the pull-down resistor 320 to establish conduction in the NMOS 310. This positive change in voltage potential is also reflected at node 219 for $V_A$ of FIG. 2B. When the NMOS 310 conducts, voltage is established in the R-switch 216 and the PMOS 215 conducts.

The RC time constant of the clamp circuit 300 in FIG. 3 is long enough to allow most of the inductor energy to be released, in accordance with one embodiment of the present invention. It is only necessary for the clamp circuit 300 to conduct when the potential at $V_A$ is rapidly increasing due to inductor flyback.

The preferred embodiment of the present invention, a circuit for preventing high voltage damage to a MOSFET switch in series with an inductor and a rechargeable battery cell due to inductive flyback, is thus described. While the present invention has been described in particular embodiments, it should be appreciated that the present invention should not be construed as limited by such embodiments, but rather construed according to the below claims.

What is claimed is:

1. A protection circuit comprising:
   a first transistor coupled in series to a load, an inductor, and a battery cell; and
   a second circuit for temporarily turning-on said first transistor when said first transistor is turned-off from a previously conductive state, said second circuit coupled to a first gate of said first transistor.

2. The protection circuit of claim 1, wherein said first transistor is a PMOS, said PMOS comprising:
   a first source coupled in series to said inductor and to a positive terminal of said battery cell; and
   a first drain coupled to said load.

3. The protection circuit of claim 1, further comprising a switch for turning-off said first transistor for preventing over-loading said protection circuit, said switch coupling said first gate to said first source of said first transistor when said switch turns-off said first transistor, and said switch coupled to a ground when said first transistor is turned-on.

4. The protection circuit of claim 3, further comprising a first resistor coupled in series between said first gate and said first source when said first transistor is turned-off by said switch.

5. The protection circuit of claim 3, further comprising an overcurrent sensing circuit, said overcurrent sensing circuit activating said switch to turn off said first transistor.

6. The protection circuit of claim 3, wherein said second circuit temporarily turns-on said first transistor when a positive rate change of voltage with respect to time occurs at said first gate due to inductive flyback from said inductor, said transistor turned-off by said switch.

7. The protection circuit of claim 3, wherein said second circuit is a differentiator circuit.

8. The protection circuit of claim 7, wherein said differentiator circuit has an RC time constant.

9. The protection circuit of claim 8, wherein said differentiator circuit is comprised of:
   a capacitor including a first terminal and a second terminal;
   a pull-down resistor; and
   an NMOS, said NMOS including a second gate, a second drain, and a second source.

10. The protection circuit of claim 9, wherein said differentiator circuit further comprises:
    a top terminal, said top terminal coupled to said first gate, said top terminal coupled to said first terminal, said top terminal coupled to said second drain; and
    a first node, said first node coupled to said second gate, said first node coupled to said second terminal, said first node coupled in series with said pull-down resistor and said ground, said ground also coupled to said second source.

11. The protection circuit of claim 1, wherein said battery cell is a rechargeable battery cell.

12. The protection circuit of claim 1, further comprising a reverse-biased diode coupled across said first transistor.

13. The protection circuit of claim 1, wherein said protection circuit is formed on a semiconductor substrate.

14. A protection circuit comprising:
    a PMOS coupled in series to a load, an inductor, and a re-chargeable battery cell, said PMOS switched to a non-conductive state by a switch in order to prevent current over-loading in said protection circuit, said PMOS having a first source coupled in series to said inductor and to a positive terminal of said battery cell, a first drain coupled to said load, and a first gate coupled to said first source;
    a first resistor coupled in series between said first gate and said first source; and
    a second circuit for temporarily allowing said PMOS to conduct when a positive rate change of voltage with respect to time occurs at said first gate due to inductive flyback from said inductor, said second circuit coupled to said first gate.

15. The protection circuit of claim 14, wherein said second circuit is a differentiator circuit.

16. The protection circuit of claim 15, wherein said differentiator circuit has an RC time constant, said differentiator circuit comprised of:
   a capacitor having a first terminal and a second terminal;
   a pull-down resistor; and
   an NMOS, said NMOS having a second gate, a second drain, and a second source.

17. The protection circuit of claim 16, wherein said differentiator circuit further comprises:
   a top terminal, said top terminal coupled to said first gate, said top terminal coupled to said first terminal, said top terminal coupled to said second drain; and
   a first node, said first node coupled to said second gate, said first node coupled to said second terminal, said first node coupled in series with said pull-down resistor and a ground, said ground also coupled to said second source.

18. The protection circuit of claim 14, wherein said protection circuit is formed on a semiconductor substrate.

19. A protection circuit comprising:
   a first transistor coupled in series to a load, an inductor, and a battery cell, said first transistor including a first source coupled in series to said inductor and to a positive terminal of said battery cell, said first transistor including a first gate and a first drain coupled to said load;
   a first means for turning-off said first transistor for preventing over-loading said protection circuit; and
   a second means for temporarily turning-on said first transistor, when said first transistor is turned-off, in response to inductive flyback from said inductor that results in a positive rate change of voltage with respect to time at said first gate, such that said protection circuit is protected from a voltage overload.

20. The protection circuit as described in claim 19, wherein said first transistor is a PMOS, and said second means includes a differentiator circuit with an RC time constant, said differentiator circuit comprised of:
   a capacitor including a first terminal and a second terminal;
   a pull-down resistor;
   an NMOS, said NMOS including a second gate, a second drain, and a second source;
   a top terminal, said top terminal coupled to said first gate, said top terminal coupled to said first terminal, said top terminal coupled to said second drain; and
   a first node, said first node coupled to said second gate, said first node coupled to said second terminal, said first node coupled in series with said pull-down resistor and a ground, said ground also coupled to said second source.

* * * * *